United States Patent
Lee et al.

(10) Patent No.: US 9,408,285 B2
(45) Date of Patent: Aug. 2, 2016

(54) ELECTROSTATIC DISCHARGE PROTECTION DEVICE AND CHIP COMPONENT WITH THE SAME

(71) Applicant: SAMSUNG ELECTRO-MECHANICS CO., LTD., Suwon-si, Gyeonggi-do (KR)

(72) Inventors: Hong Ryul Lee, Suwon-si (KR); Kyong Bok Min, Suwon-si (KR); Sung Kwon Wi, Suwon-si (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 0 days.

(21) Appl. No.: 14/148,255

(22) Filed: Jan. 6, 2014

(65) Prior Publication Data
US 2014/0192452 A1    Jul. 10, 2014

(30) Foreign Application Priority Data
Jan. 8, 2013    (KR) .................. 10-2013-0002063

(51) Int. Cl.
| | | |
|---|---|---|
| *H05F 3/00* | (2006.01) | |
| *H05F 3/02* | (2006.01) | |
| *H01H 47/00* | (2006.01) | |
| *H05F 3/04* | (2006.01) | |
| *H01L 23/60* | (2006.01) | |
| *H02H 9/00* | (2006.01) | |

(52) U.S. Cl.
CPC ........ *H05F 3/04* (2013.01); *H01L 23/60* (2013.01); *H01L 2924/0002* (2013.01)

(58) Field of Classification Search
CPC .................................. H05F 3/04; H02H 9/04
USPC ...................................... 361/220, 56
See application file for complete search history.

(56) References Cited

U.S. PATENT DOCUMENTS

| | | | |
|---|---|---|---|
| 5,904,980 A | 5/1999 | Rivas | |
| 5,955,762 A | 9/1999 | Hively | |
| 8,243,406 B2 * | 8/2012 | Asakura et al. | ........... 361/56 |
| 2007/0207571 A1 * | 9/2007 | Morisue et al. | ........... 438/107 |
| 2010/0087032 A1 * | 4/2010 | Yoshizawa et al. | ........... 438/99 |
| 2010/0157496 A1 * | 6/2010 | Asakura et al. | ........... 361/56 |

FOREIGN PATENT DOCUMENTS

| | | |
|---|---|---|
| JP | 2006-114801 A | 4/2006 |
| KR | 10-2010-0011933 A | 2/2010 |

\* cited by examiner

*Primary Examiner* — Thienvu Tran
*Assistant Examiner* — Lucy Thomas
(74) *Attorney, Agent, or Firm* — McDermott Will & Emery LLP

(57) ABSTRACT

Disclosed herein is an electrostatic discharge protection device including: a lower cover; electrodes disposed on the lower cover, being spaced apart from each other; a conductor disposed on the lower cover; and a semiconducting material layer covering the lower cover and the electrodes and formed of a semiconducting material.

10 Claims, 2 Drawing Sheets

ELECTROSTATIC DISCHARGE PROTECTION DEVICE AND CHIP COMPONENT WITH THE SAME

CROSS REFERENCE(S) TO RELATED APPLICATIONS

This application claims the benefit under 35 U.S.C. Section 119 of Korean Patent Application Serial No. 10-2013-0002063 entitled "Electrostatic Discharge Protection Device and Chip Component with the Same" filed on Jan. 8, 2013, which is hereby incorporated by reference in its entirety into this application.

BACKGROUND OF THE INVENTION

1. Technical Field

The present invention relates to an electrostatic discharge protection device and a chip component with the same, and more particularly, to an electrostatic discharge protection device capable of reducing manufacturing costs and improving reliability of a device and a chip component with the same.

2. Description of the Related Art

Recently, in order to transmit large-capacity data, such as moving pictures, at high speed, differential transmission methods, such as USB, IEEE394, HDMI, has been used. In a high-speed interface of the differential transmission methods, a common mode noise occurs due to an unbalance between two signal lines, and the like, in terms of the characteristics of the communication methods. In order to remove the unbalance, a chip component, such as a common mode noise filter (CMF), has been used.

In recent, a chip component having a composite structure including an electrostatic discharge protection device that is equipped in the common mode noise filter has been developed. The electrostatic discharge protection device may protect predetermined electronic components from electrostatic discharge (ESD). The chip component having the composite structure has a structure having the electrostatic discharge protection device equipped in the common mode noise filter and the electrostatic discharge protection device has a structure configured of electrodes disposed on a predetermined substrate, being apart from each other at a predetermined gap, an insulating layer covering the substrate and the electrodes, a function layer disposed on the substrate or the insulating layer, and the like.

The function layer may various structures to absorb surge current generated from the substrate and guide the absorbed surge current to a ground layer. As an example, the functional layer may be provided in a metal thin film along a boundary surface between the substrate and the insulating layer. As another example, the functional layer may also be provided in a layer form in which the insulating layer is formed of a metal-insulating composite material.

RELATED ART DOCUMENT

Patent Document (Patent Document 1) Japanese Patent Laid-Open Publication No. 2006-114801

SUMMARY OF THE INVENTION

An object of the present invention is to provide an electrostatic discharge protection device capable of reducing manufacturing costs and a chip component with the same.

Another object of the present invention is to provide an electrostatic discharge protection device capable of improving reliability of a device and a chip component with the same.

According to an exemplary embodiment of the present invention, there is provided an electrostatic discharge protective device, including: a lower cover; electrodes disposed on the lower cover, being spaced apart from each other; a conductor disposed on the lower cover; and a semiconducting material layer covering the lower cover and the electrodes and formed of a semiconducting material.

The conductor may be provided on a boundary surface between the lower cover and the semiconducting material layer in a thin film form and the semiconducting material layer may cover the conductor.

The semiconducting material layer may cover the lower cover and the electrodes and the conductor may be distributed within the semiconducting material layer.

The semiconducting material may a polymer material satisfying an electric conductivity ($\Omega^{-1}$ cm$^{-1}$) of $10^{-9}$ to $10^3$.

The semiconducting material may include at least any one of polyacetylene, poly (p-phenylene) (PPP), polypyrrole (PYR), and polyazine (PAZ)

The semiconducting material layer may include a polymer material and additives and the additives may include at least any one dopant of halogen, lewis acid, and protonic acid.

The semiconducting material layer may include a polymer material and additives and the additives may include at least any one dopant of $O_2$, $XeF_2$, $AgClO_4$, $AgBF_4$, and $No_2BF_2$.

The conductor may include at least any one of palladium (Pd), rhodium (Rh), silver (Ag), gold (Au), cobalt (Co), nickel (Ni), and copper (Cu).

The electrostatic discharge protective device may further include: an upper cover covering the semiconducting material layer, wherein the upper cover is formed of the same material as the lower cover.

According to another exemplary embodiment of the present invention, there is provided a chip component, including: a noise filter; and an electrostatic discharge protection device included in the noise filter, wherein the electrostatic discharge protection device includes: a lower cover; electrodes disposed on the lower cover, being spaced apart from each other; a conductor disposed on the lower cover; and a semiconducting material layer covering the lower cover and the electrodes and formed of a semiconducting material.

The noise filter may include: a ferrite substrate; a coil electrode disposed on the ferrite substrate; an external electrode connected with the coil electrode in an edge region of the ferrite substrate; and a filled material covering the coil electrode exposed by the external electrode.

The conductor may be provided on a boundary surface between the lower cover and the semiconducting material layer in a thin film form and the semiconducting material layer may cover the conductor.

The semiconducting material layer may cover the lower cover and the electrodes and the conductor may be distributed in the semiconducting material layer.

The semiconducting material may include a polymer material that satisfies an electric conductivity ($\Omega^{-1}$ cm$^{-1}$) of $10^{-9}$ to $10^3$.

The semiconducting material may include at least any one of polyacetylene, poly (p-phenylene) (PPP), polypyrrole (PYR), and polyazine (PAZ).

The semiconducting material layer may include a polymer material and additives and the additives may include at least any one dopant of halogen, lewis acid, protonic acid, $O_2$, $XeF_2$, $AgClO_4$, $AgBF_4$, and $No_2BF_2$.

DESCRIPTION OF THE PREFERRED EMBODIMENTS

Figure 1:
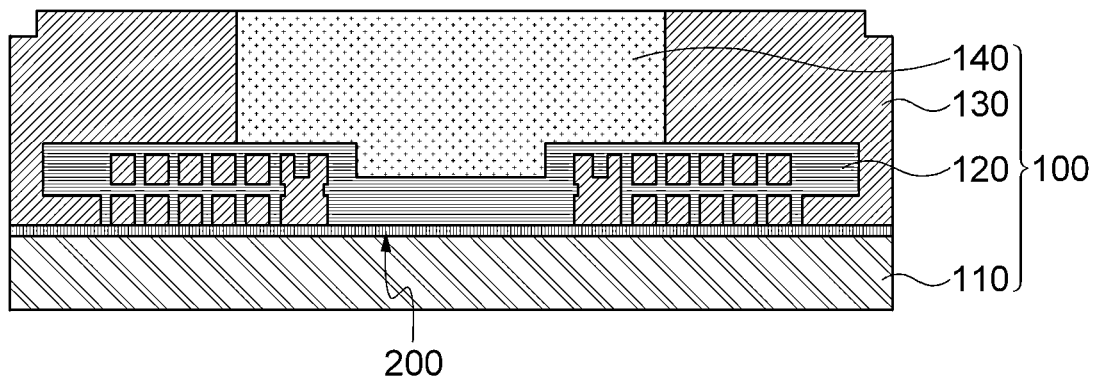
FIG. 1 is a diagram illustrating a chip component according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals throughout the specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In drawings, the thickness of layers and regions is exaggerated for efficient description of technical contents. Therefore, exemplified forms may be changed by manufacturing technologies and/or tolerance. Therefore, the exemplary embodiments of the present invention are not limited to specific forms but may include the change in forms generated according to the manufacturing processes For example, a region vertically shown may be rounded or may have a predetermined curvature.

Hereinafter, an electrostatic discharge protection device and a chip component with the same according to exemplary embodiments of the present invention will be described in detail with reference to the accompanying drawings.

FIG. 1 is a diagram illustrating a chip component according to an exemplary embodiment of the present invention. Referring to FIG. 1, a chip component 10 according to an exemplary embodiment of the present invention may have a structure in which an electrostatic discharge protection device 200 is included in a noise filter 100.

The noise filter 100 may be a common mode noise filter (CMF). The noise filter 100 may be a component to remove a common mode noise that occurs at a high-speed interface in a differential transmission method.

The noise filter 100 may include a base 110, a coil 120, an external electrode 130, and a filled material 140. The base 110 may be a plate for manufacturing components 120, 130, and 140 of the noise filter 100. As the base 110, a magnetic substrate, such as a ferrite substrate, may be used. The coil 120 may be disposed on the ferrite substrate. The coil 120 may be provided in a double layer coil structure in which a plurality of coils are multi-layered. The external electrode 130 may have a structure to cover an outer region of the coil 120. Further, a central part of the external electrode 130 is provided with an opening exposing the coil 120 and the filled material 140 may be filled in the opening. The filled material 140 may be a magnetic material such as ferrite.

The electrostatic discharge protective device 200 may be disposed between the substrate 110 and the coil 120. When surge current, high voltage, and leakage current, and the like occurs, the electrostatic discharge protection device 200 may be a component to absorb them.

In the chip component 10 having the foregoing structure, the noise filter 100 and the electrostatic discharge protection device 200 are integrally coupled with each other to have a filter structure that can absorb the electrostatic discharge.

Figure 2:
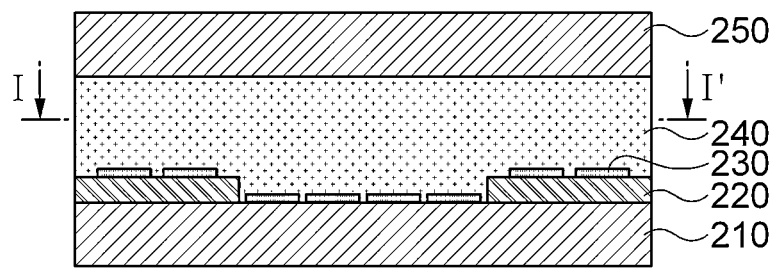
FIG. 2 is a cross-sectional view illustrating an example of an electrostatic discharge protection device illustrated in FIG. 1.
Figure 3:
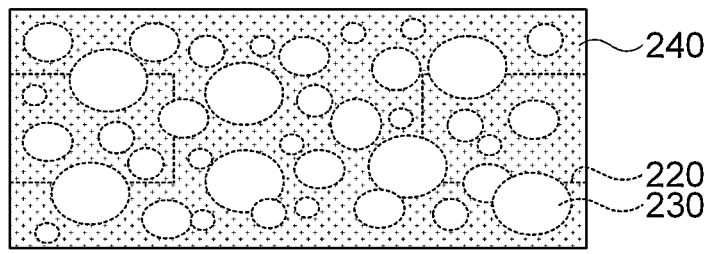
FIG. 3 is a cross-sectional view illustrating an appearance taken along the line I-I' illustrated in FIG. 2.

FIG. 2 is a cross-sectional view illustrating an example of the electrostatic discharge protective device illustrated in FIG. 1 and FIG. 3 is a cross-sectional view illustrating an appearance taken along the line I-I' illustrated in FIG. 2.

Referring to FIGS. 1 to 3, the electrostatic discharge protection device 200 of the chip component 10 may include a lower cover 210, electrodes 220, a conductor 230, a semiconducting material layer 240, and an upper cover 250.

The lower cover 210 may be component protect components 220, 230 and 240 of the electrostatic discharge protective device 200 together with the upper cover 250. The lower cover 210 may be various kinds of insulating layers. As an example, as the lower cover 210 an inorganic oxide layer may be used. As another example, as the lower cover 210 a ceramic sheet, a varistor sheet, a substrate formed of a liquid crystal polymer material, other various kinds of insulating sheets, and the like may be used. As another example, as the lower cover 210 a magnetic substrate, such as a ferrite substrate, may also be used. The upper cover 250 is to cover the upper part of the electrostatic discharge protective device 200 and may be preferably formed of the same material as the lower cover 210. Alternatively, the upper cover 250 may be optionally formed of a material different from the lower cover 210.

The electrodes 220 may be disposed on the lower cover 210, being spaced apart from each other. As an example, the electrodes 220 may include a first electrode disposed on one portion of the lower cover 210 and a second electrode disposed on the other portion of the lower cover 210 to face the first electrode. At least any one of the first and second electrodes may be connected with a ground layer. The electrodes 220 may be formed of various kinds of metals. As an example, the electrodes 220 may be a metal pattern formed of copper (Cu).

The conductor 230 may disposed on the lower cover 210 and the electrodes 220. For example, the conductor 230 may be disposed on a boundary surface between the lower cover 210 and the semiconducting material layer 240 and a boundary surface between the electrodes 220 and the semiconducting material layer 240 in a thin film form. The conductor 230 may be provided in a plurality of irregular island form. Further, the conductor 230 may irregularly disposed over the lower cover 210 and a surface of the electrodes 220.

The conductor 230 may be formed of various conductive materials. For example, the conductor 230 may be formed of at least any one of palladium (Pd), rhodium (Rh), silver (Ag), gold (Au), cobalt (Co), tin (Sn), and nickel (Ni). The conductor 230 may be formed of any one selected from the foregoing metals. Optionally, however, the conductor 230 may be formed of an alloy of at least two of the metals.

The conductor 230 may be formed by performing a metal thin film forming process on the lower cover 210 on which the electrodes 220 are formed. As an example, the conductor 230 may be formed by performing a sputtering process on the lower cover 210 using a metal target. As another example, the conductor 230 may be formed by performing an electron beam evaporation process on the lower cover 210. In addition, the conductor 230 may be formed by performing various types of physical vapor deposition (PVD) processes, such as a thermal evaporation process, a laser molecular beam epitaxy (L-MBE) process, a pulsed laser deposition (PLD) process, and the like, on the lower cover 210.

The semiconducting material layer 240 may be a layer formed of a semiconducting material having electrical conductivity of an intermediate degree between conductivity and insulating property. The semiconducting material layer 240 may have a structure covering the lower cover 210, the electrodes 220, and the conductor 230 between the lower and upper covers 210 and 250.

The conductor 230 and the semiconducting material layer 240 having the foregoing structure may configure the electrostatic discharge absorbing layer that absorbs the electrostatic discharge. The electrostatic discharge absorbing layer may be used as a functional layer that absorbs or interrupts the electrostatic discharge (ESD). The electrostatic discharge absorbing layer is to move the surge current to the ground layer connected to the electrodes 220 when the surge current, the high voltage, the leakage current, and the like, are generated in the electrostatic discharge protection device 200 and has the insulating property prior to the occurrence of the surge current and may generate a current path through which the surge current flows in the electrodes 220 only at the time of the occurrence of the surge current.

In order to exhibit the function as the foregoing functional layer, the semiconducting material layer 240 may have electric conductivity within a proper range. For example, the semiconducting material layer 240 may satisfy the electric conductivity ($\Omega^{-1}$ cm$^{-1}$) of approximately $10^{-9}$ to $10^3$. When the electric conductivity of the semiconducting material layer 240 is less than $10^{-9}$, the electric conductivity is remarkable low and thus approximates the insulation, such that the semiconducting material layer 240 may be difficult to secure the minimum electric conductivity that can exhibit performance as the functional layer. On the other hand, when the electric conductivity of the semiconducting material layer 240 exceeds $10^3$, the electric conductivity is remarkably increased and thus approximates the conductivity, such that the semiconducting material layer 240 may exceed the maximum electric conductivity that may exhibit the performance as the functional layer. An example of the semiconducting material satisfying the electric conductivity may include polyacetylene, poly (p-phenylene) (PPP), polypyrrole (PYR), and polyazine (PAZ), and the like.

Further, the semiconducting material layer 240 may further include various kinds of additives. The additives are to control the electric conductivity of the semiconducting material layer 240 and may be used along with the foregoing polymer material to control the detailed electric conductivity of the semiconducting material layer 240. As the additives, at least any one dopant of halogen, lewis acid, and protonic acid may be used.

As the halogen additives, at least any one of $F_2$, $Cl_2$, $Br_2$, $I_2$, $ICl_2$, and IBr may be used. As the lewis acid additives, at least any one of $PF_3$, $AsF_3$, $SbF_3$, $BF_3$, $BCl_3$, $BBr_3$, $FeCl_3$, and $AlCl_3$ may be used. Further, the protonic acid additives, at least any one of HF, HCl, HBr, $HClO_4$, and $ClSO3H$ may be used. As other additives, at least any one dopant of $O_2$, $XeF_2$, $AgClO_4$, $AgBF_4$, and $No_2BF_2$ may also be used.

Polymer materials that become a material of the foregoing semiconducting material layer 240 and the electric conductivity thereof are as the following Table 1.

TABLE 1

| Semiconducting Material | Electric Conductivity ($\Omega^{-1}$cm$^{-1}$) |
|---|---|
| Polyacetylene(PA) | $10^{-4}$~$10^{-9}$ |
| Poly(p-phenylene) (PPP) | $10^{-1}$~$10^{-11}$ |
| Poly(p-phenylene sulfide) (PPS) | 200 |
| Polypyrrole(PYR) | 40~100 |
| Polyazine(PAZ) | $10^{-1}$~$10^{-5}$ |
| Additive doped Polyacetylene(PA) | $10^3$~10−9 |

In the electrostatic discharge protective device 200 having the above-mentioned structure, the semiconducting material layer 240 used as the functional layer may be formed of the semiconducting polymer material. In this case, comparing with the case in which the functional layer is formed of a relatively expensive metal-insulating composite material, the manufacturing cost of the electrostatic discharge protective device 200 may be reduced. Further, the polymer material has the high adhesion with another object as compared with the metal-insulating composite material, such that the adhesion between the functional layer and the covers 210 and 250 and the adhesion between the functional layer and the electrodes 220 may be improved. In this case, comparing with the case in which the functional layer is formed of the metal-insulating composite material having a relatively low adhesion, the reliability of the device 200 may be improved.

As described above, the electrostatic discharge protective devices 200 and 201 according to the exemplary embodiment of the present invention includes the electrodes 220 disposed on the lower cover 210, being spaced apart from each other and the electrostatic discharge absorbing layer disposed on the lower cover 210 to absorb the electrostatic discharge (ESD) and the electrostatic discharge absorbing layer may be configured of the conductor 230 and the semiconducting material layer 240 having a semiconducting material. In this case, when the functional layer is formed of the expensive metal-insulating composite material, the functional layer may be manufactured using a cheap polymer material. Therefore, according to the electrostatic discharge protection device and the chip component with the same according to the exemplary embodiments of the present invention, the functional layer can be configured of a conductor and a semiconducting material layer formed of a relatively cheap semiconducting material, thereby saving the manufacturing costs as compared with the case in which the functional layer is formed of the metal-insulating composite material.

Further, according to the exemplary embodiments of the present invention, the electrostatic discharge protection device and the chip component with the same can use the polymer material having the high adhesion as the material of the semiconducting material layer configuring the functional layer the functional layer to increase the adhesion between the components different from the functional layer as compared with the case in which the functional layer is formed of the metal-insulating composite material, thereby improving the reliability of the device.

Hereinafter, an electrostatic discharge protective device 201 according to another exemplary embodiment of the present invention will be described in detail. Herein, the overlapping contents of the electrostatic discharge protective device 200 according to the exemplary embodiment of the present invention as described above will be omitted or simplified.

Figure 4:
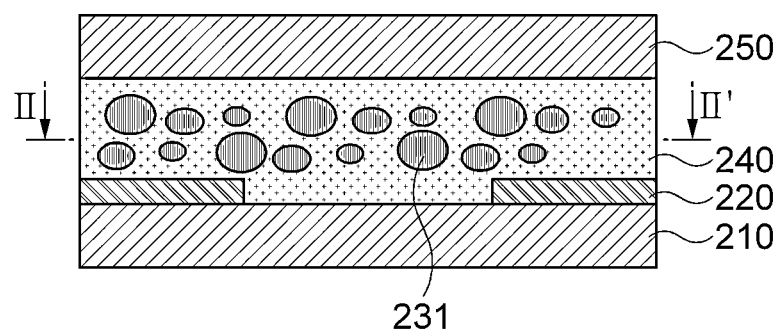
FIG. 4 is a cross-sectional view illustrating another example of an electrostatic discharge protection device illustrated in FIG. 1.
Figure 5:
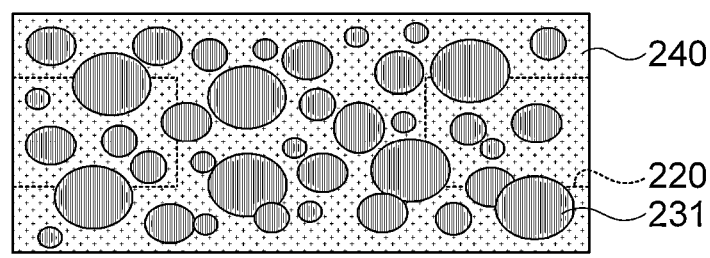
FIG. 5 is a cross-sectional view illustrating an appearance taken along the line II-II' illustrated in FIG. 1.

FIG. 4 is a cross-sectional view illustrating another example of the electrostatic discharge protective device illustrated in FIG. 1 and FIG. 5 is a cross-sectional view illustrating an appearance taken along the line II-II' illustrated in FIG. 1.

Referring to FIGS. 4 and 5, the electrostatic discharge protective device 201 according to another exemplary embodiment of the present invention includes the lower cover 210, the electrodes 220, the conductor 231, the semiconducting material layer 240, and the upper cover 250 and the conductor 231 may be provided to have a form in which the conductor 231 is irregularly included in the semiconducting material layer 240.

The conductor 231 may be distributed over the semiconducting material layer 240 as a plurality of irregular islands. The conductor 231 may be formed of various metal materials, such as palladium (Pd), rhodium (Rh), silver (Ag), gold (Au), cobalt (Co), tin (Sn), nickel (Ni), and the like.

The conductor 230 and the semiconducting material layer 240 may configure the electrostatic discharge absorbing layer functioning as the functional layer that absorbs the electrostatic discharge. The functional layer may be formed by preparing a metal-semiconducting material composite material prepared by mixing a polymer material that becomes a material of the semiconducting material layer 240 and metal that becomes a material of the conductor 230 and then applying the metal-semiconducting material composite material to the lower cover 210. In this case, the electric conductivity of the metal-semiconducting material composite material may be controlled by controlling a content of the conductor 230.

According to the electrostatic discharge protection device and the chip component with the same according to the exemplary embodiments of the present invention, the functional layer can be configured of a conductor and a semiconducting material layer formed of a relatively cheap semiconducting material, thereby saving the manufacturing costs as compared with the case in which the functional layer is formed of the metal-insulating composite material.

Further, according to the exemplary embodiments of the present invention, the electrostatic discharge protection device and the chip component with the same can use the polymer material having the high adhesion as the material of the semiconducting material layer configuring the functional layer to increase the adhesion between the components different from the functional layer as compared with the case in which the functional layer is formed of the metal-insulating composite material, thereby improving the reliability of the device.

The present invention has been described in connection with what is presently considered to be practical exemplary embodiments. In addition, the above-mentioned description discloses only the exemplary embodiments of the present invention. Therefore, it is to be appreciated that modifications and alterations may be made by those skilled in the art without departing from the scope of the present invention disclosed in the present specification and an equivalent thereof. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. An electrostatic discharge protective device, comprising:
   a lower cover;
   electrodes disposed on the lower cover, being spaced apart from each other;
   a conductor; and
   a semiconducting material layer covering the lower cover and the electrodes and formed of a semiconducting material,
   wherein the semiconducting material includes at least any one of polyacetylene, poly (p-phenylene) (PPP), polypyrrole (PYR), and polyazine (PAZ), and
   the conductor is distributed within the semiconducting material layer and separated from a boundary surface between the lower cover and the semiconducting material layer.

2. The electrostatic discharge protective device according to claim 1, wherein the semiconducting material includes a polymer material satisfying an electric conductivity ($\Omega^{-1}$ $cm^{-1}$) of $10^{-9}$ to $10^3$.

3. The electrostatic discharge protective device according to claim 1, wherein the semiconducting material layer includes a polymer material and additives and
   the additives include at least any one dopant of halogen, lewis acid, and protonic acid.

4. The electrostatic discharge protective device according to claim 1, wherein the semiconducting material layer includes a polymer material and additives and
   the additives include at least any one dopant of $O_2$, $XeF_2$, $AgClO_4$, $AgBF_4$, and $No_2BF_2$.

5. The electrostatic discharge protective device according to claim 1, wherein the conductor includes at least any one of palladium (Pd), rhodium (Rh), silver (Ag), gold (Au), cobalt (Co), nickel (Ni), and copper (Cu).

6. The electrostatic discharge protective device according to claim 1, further comprising:
   an upper cover covering the semiconducting material layer, wherein the upper cover is formed of the same material as the lower cover.

7. A chip component, comprising:
   a noise filter; and
   an electrostatic discharge protection device included in the noise filter,
   wherein the electrostatic discharge protection device includes:
   a lower cover;
   electrodes disposed on the lower cover, being spaced apart from each other;
   a conductor;
   a semiconducting material layer covering the lower cover and the electrodes and formed of a semiconducting material, and
   the semiconducting material includes at least any one of polyacetylene, poly (p-phenylene) (PPP), polypyrrole (PYR), and polyazine (PAZ), and
   the conductor is distributed within the semiconducting material layer and separated from a boundary surface between the lower cover and the semiconducting material layer.

8. The chip component according to claim 7, wherein the noise filter includes:
   a ferrite substrate;

a coil electrode disposed on the ferrite substrate;
an external electrode connected with the coil electrode in an edge region of the ferrite substrate; and
a filled material covering the coil electrode exposed by the external electrode.

9. The chip component according to claim 7, wherein the semiconducting material includes a polymer material that satisfies an electric conductivity ($\Omega^{-1}$ cm$^{-1}$) of $10^{-9}$ to $10^{3}$.

10. The chip component according to claim 7, wherein the semiconducting material layer includes a polymer material and additives and
the additives include at least any one dopant of halogen, lewis acid, protonic acid, $O_2$, $XeF_2$, $AgClO_4$, $AgBF_4$, and $No_2BF_2$.

* * * * *